(12) United States Patent
Murata et al.

(10) Patent No.: US 12,088,116 B2
(45) Date of Patent: Sep. 10, 2024

(54) WIRELESS POWER TRANSMISSION DEVICE AND WIRELESS POWER TRANSMISSION SYSTEM

(71) Applicant: KABUSHIKI KAISHA TOSHIBA, Minato-ku (JP)

(72) Inventors: Kentaro Murata, Ota (JP); Kohei Onizuka, Shinagawa (JP); Toshiya Mitomo, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/163,943

(22) Filed: Feb. 1, 2021

(65) Prior Publication Data

US 2021/0159735 A1    May 27, 2021

Related U.S. Application Data

(63) Continuation of application No. 16/268,031, filed on Feb. 5, 2019, now abandoned.

(30) Foreign Application Priority Data

Feb. 6, 2018  (JP) ................. 2018-019372
Jan. 7, 2019  (JP) ................. 2019-000720

(51) Int. Cl.
*H02J 50/20* (2016.01)
*G01R 31/40* (2020.01)
*H02J 50/40* (2016.01)
*H02J 50/80* (2016.01)
*H02J 50/90* (2016.01)

(52) U.S. Cl.
CPC .............. *H02J 50/20* (2016.02); *G01R 31/40* (2013.01); *H02J 50/40* (2016.02); *H02J 50/80* (2016.02); *H02J 50/90* (2016.02)

(58) Field of Classification Search
CPC ................... H02J 50/00; H04B 5/00
See application file for complete search history.

(56) References Cited

U.S. PATENT DOCUMENTS

| 8,159,364 | B2 | 4/2012 | Zeine |
| 9,553,473 | B2 | 1/2017 | Zeine et al. |
| 10,075,023 | B2 | 9/2018 | Nishioka |
| 10,158,259 | B1 * | 12/2018 | Leabman ............... H02J 50/80 |

(Continued)

FOREIGN PATENT DOCUMENTS

| JP | 2012-205411 A | 10/2012 |
| JP | 5738416 | 6/2015 |

(Continued)

*Primary Examiner* — Adi Amrany
(74) *Attorney, Agent, or Firm* — Oblon, McClelland, Maier & Neustadt, L.L.P.

(57) ABSTRACT

A wireless power transmission device that transmits wireless power by a radio wave to a plurality of power receivers, has a power transmission condition calculator that calculates power transmission conditions including power transmission periods of two or more of a plurality of different power transmission patterns based on receiving power information and required electric energy information from the plurality of power receivers, and power transmission circuitry that transmits a radio wave while switching between the two or more power transmission patterns under the calculated power transmission conditions.

10 Claims, 13 Drawing Sheets

(56) References Cited

U.S. PATENT DOCUMENTS

| | | |
|---|---|---|
| 2012/0112555 A1 | 5/2012 | Toshimitsu |
| 2012/0329405 A1* | 12/2012 | Lee |
| 2016/0268813 A1* | 9/2016 | Reynolds ............ G10K 11/346 |
| 2016/0278065 A1* | 9/2016 | Kim ..................... G07C 5/0816 |
| 2017/0063167 A1 | 3/2017 | Uchida |
| 2017/0288475 A1* | 10/2017 | Lee ....................... H04L 5/0048 |
| 2018/0183259 A1* | 6/2018 | Lee ......................... H02J 50/90 |
| 2018/0226839 A1 | 8/2018 | Higaki et al. |
| 2018/0254671 A1 | 9/2018 | Murata et al. |
| 2018/0301937 A1* | 10/2018 | Park ....................... H02J 50/60 |
| 2019/0067825 A1* | 2/2019 | Zeine ..................... H01Q 13/20 |
| 2019/0154439 A1* | 5/2019 | Binder ................... G01B 11/26 |
| 2019/0199139 A1* | 6/2019 | Perry ..................... H02J 50/12 |
| 2019/0272943 A1 | 9/2019 | Leem |

FOREIGN PATENT DOCUMENTS

| | | |
|---|---|---|
| JP | 2016-512677 | 4/2016 |
| JP | 2018-125815 | 8/2018 |
| JP | 2018-148619 | 9/2018 |
| JP | 6399368 | 10/2018 |

\* cited by examiner

| POWER TRANSMISSION PATTERN NO. / POWER RECEIVER NO. | RECEIVING POWER | | | | REQUIRED ELECTRIC ENERGY |
|---|---|---|---|---|---|
| | 1 | 2 | ... | K | |
| 1 | xxxxx | xxxxx | | xxxxx | xxxxx |
| 2 | xxxxx | xxxxx | | xxxxx | xxxxx |
| ⋮ | | | | | |
| N | xxxxx | xxxxx | | xxxxx | xxxxx |

| POWER TRANSMISSION PERIOD | xxxxx | xxxxx | | xxxxx |
|---|---|---|---|---| though a power transmission pulse is distributed to a specific target power receiver, the radio wave including the power transmission pulse is spatially diffused and received by other power receivers. In fact, there has not been conventionally suggested any method for optimal power distribution that takes this matter into consideration.

WIRELESS POWER TRANSMISSION DEVICE AND WIRELESS POWER TRANSMISSION SYSTEM

CROSS REFERENCE TO RELATED APPLICATIONS

This application is a continuation of U.S. application Ser. No. 16/268,031, filed Feb. 5, 2019, which is based upon and claims the benefit of priority from the prior Japanese Patent Applications No. 2018-19372 filed on Feb. 6, 2018 and No. 2019-720 filed on Jan. 7, 2019, the entire contents of which are incorporated herein by reference.

FIELD

Embodiments of the present invention relate to a wireless power transmission device and a wireless power transmission system.

BACKGROUND

There is known a technique for transmitting radio waves based on a plurality of antenna patterns from a power transmitter, notifies by a power receiver the ID of the antenna pattern in which the maximum receiving power was obtained by the power receiver to the power transmitter, and transmitting power based on the notified antenna pattern.

In addition, there is also known a technique for optimizing the distribution of power transmission pulses to be transmitted to a plurality of power receivers according to battery demands of the power receivers and transmitting the transmission pulses to the individual power receivers.

However, even though a power transmission pulse is distributed to a specific target power receiver, the radio wave including the power transmission pulse is spatially diffused and received by other power receivers. In fact, there has not been conventionally suggested any method for optimal power distribution that takes this matter into consideration.

DETAILED DESCRIPTION

Figure 1:
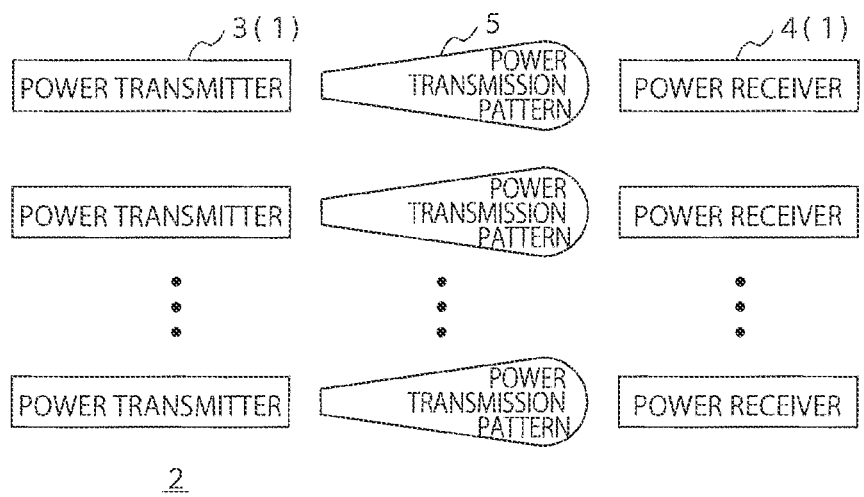
FIG. 1 is a block diagram illustrating a schematic configuration of a wireless power transmission system including wireless power transmission devices according to a first embodiment.

According to one embodiment, a wireless power transmission device that transmits wireless power by a radio wave to a plurality of power receivers, has a power transmission condition calculator that calculates power transmission conditions including power transmission periods of two or more of a plurality of different power transmission patterns based on receiving power information and required electric energy information from the plurality of power receivers, and power transmission circuitry that transmits a radio wave while switching between the two or more power transmission patterns under the calculated power transmission conditions.

Embodiments will be described below with reference to the drawings. For the ease of understanding and the convenience of illustration, some of components are omitted or described and illustrated in a modified or simplified manner in this specification and the attached drawings. However, the embodiments are to be interpreted including technical matter that can be expected to perform similar functions. For the convenience of illustration and the ease of understanding, the reduction scales and the length-to-width ratios are modified and exaggerated as appropriate in the drawings attached to this specification.

First Embodiment

FIG. 1 is a block diagram illustrating a schematic configuration of a wireless power transmission system 2 including wireless power transmission devices 1 according to a first embodiment. The wireless power transmission system 2 illustrated in FIG. 1 includes one or more power transmitters 3 and a plurality of power receivers 4. When there are two or more power transmitters 3, the power transmitters 3 transmit or receive information to or from each other in a wireless or wired manner to generate a plurality of power transmission patterns 5 in cooperation. Radio waves based on two or more of the power transmission patterns 5 generated by the one or more power transmitters 3 are transmitted to the plurality of power receivers 4. More specifically, the one or more power transmitters 3 transmit radio waves while switching in sequence between the two or more of the power transmission patterns 5. Each of the power transmission patterns 5 is transmitted in its specific transmission periods. Each of the power receivers 4 receives the foregoing radio waves transmitted from the one or more power transmitters 3 and generates direct-current power. The wireless power transmission device 1 illustrated in FIG. 1 is a collective term of the power transmitter 3 and the power receiver 4. In some cases, the one or more power transmitters may transmit radio waves based on only one power transmission pattern 5. However, mainly in the example described below, the one or more power transmitters 3 transmit radio waves based on two or more of the power transmission patterns 5 while switching.

Figure 2:
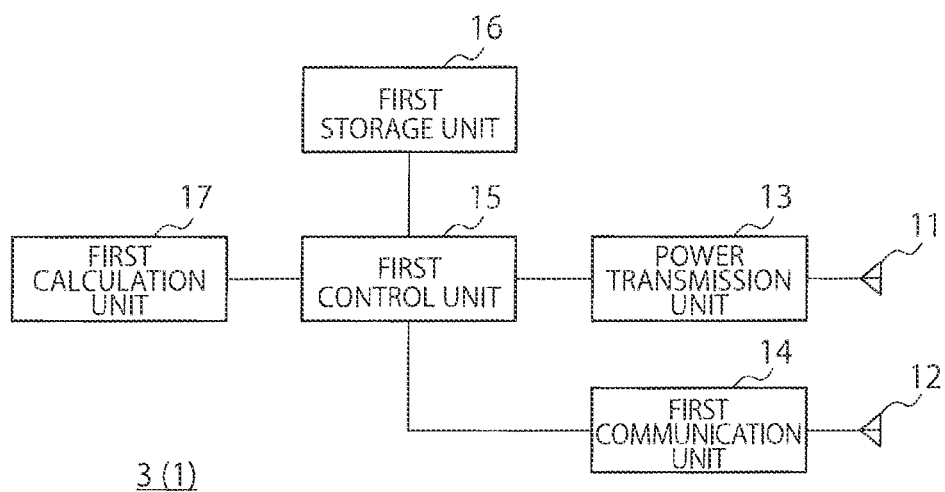
FIG. 2 is a block diagram illustrating an example of an internal configuration of a power transmitter.

FIG. 2 is a block diagram illustrating an example of an internal configuration of a power transmitter 3. The power transmitter 3 illustrated in FIG. 2 has a power transmission antenna 11, a first communication antenna 12, a power transmission unit (power transmission circuitry) 13, a first communication unit (first communicator) 14, a first control unit (first controller) 15, a first storage unit 16, and a first calculation unit (first calculator) 17.

The power transmission unit 13 performs trial power transmission and actual power transmission. In the trial power transmission, the power transmission unit 13 transmits radio waves based on a plurality of power transmission patterns 5 at different timings. In the actual power transmission, the power transmission unit 13 transmits radio waves while switching between two or more of the power transmission patterns 5, based on the receiving power information and required electric energy information from the plurality of power receivers 4.

The first communication unit 14 is not intended to transmit wireless power but transmits or receives various kinds of information to or from the plurality of power receivers 4. For example, the first communication unit 14 receives the receiving power information and the required electric energy information transmitted by the plurality of power receivers 4.

The first calculation unit 17 calculates power transmission conditions including respective power transmission periods of the two or more of the power transmission patterns 5, based on the receiving power information and the required electric energy information from the plurality of power receivers 4. The power transmission conditions calculated by the first calculation unit 17 may include not only the power transmission periods of the power transmission patterns 5 but also a parameter including at least one of the directions of the two or more power transmission patterns 5, the phases of the radio waves, and the amplitudes of the radio waves.

The first storage unit 16 stores the power transmission conditions calculated by the first calculation unit 17 and others. For example, the first storage unit 16 stores the power transmission periods of the power transmission patterns 5 and the parameter described above, and others. In addition, the first storage unit 16 may store the receiving power information and required electric energy information from the plurality of power receivers 4.

The first control unit 15 controls the respective portions of the power transmission unit 13. For example, the first control unit 15 performs control for transmitting the receiving power information and required electric energy information received by the first communication unit 14 to the first calculation unit 17 and control for transmitting the power transmission conditions calculated by the first calculation unit 17 to the power transmission unit 13. The first control unit 15 also controls writing of various kinds of information into the first storage unit 16 and controls reading of various kinds of information from the first storage unit 16.

When the plurality of power transmitters 3 is provided, the power transmitters 3 may share the first communication antenna 12, the first communication unit 14, the first control unit 15, the first calculation unit 17, and a power signal source not illustrated. This makes it possible to simplify the respective internal configurations of the power transmitters 3.

Figure 3:
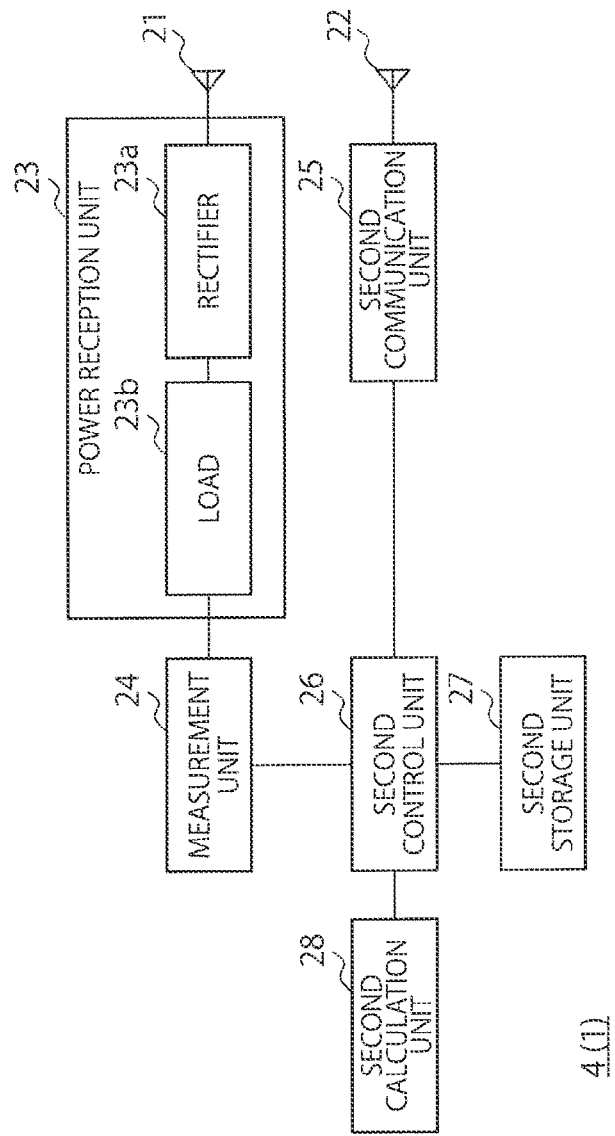
FIG. 3 is a block diagram illustrating an example of an internal configuration of a power receiver.

FIG. 3 is a block diagram illustrating an example of an internal configuration of the power receiver 4. The power receiver 4 illustrated in FIG. 3 has a power receiving antenna 21, a second communication antenna 22, a power reception unit (power reception circuitry) 23, a measurement unit 24, a second communication unit (second communicator) 25, a second control unit (second controller) 26, a second storage unit 27, and a second calculation unit (second calculator) 28.

The power reception unit 23 receives radio waves from the one or more power transmitters 3 and generates direct-current power. The power reception unit 23 has a rectifier 23a and a load 23b. The rectifier 23a converts received alternating-current power into direct-current power. The measurement unit 24 measures the receiving power defined by the amplitude of the direct-current power at the load 23b. Besides, the power reception unit 23 may have a matching device and a DC-DC converter. The matching device performs impedance matching between the power receiving antenna 21 and the rectifier 23a. The DC-DC converter transforms the voltage after the rectification.

The second communication unit 25 transmits or receives various kinds of information to or from the one or more power transmitters 3 via the second communication antenna 22. For example, the second communication unit 25 transmits to the one or more power transmitters 3 the information of the receiving power by the radio waves based on the plurality of power transmission patterns 5 and required electric energy information. The second storage unit 27 calculates the required electric energy information of the power receivers 4. The required electric energy information is calculated based on the charging states and power consumptions of the power receivers 4. The second storage unit 27 stores the receiving power information, the required electric energy information, and others. The second control unit 26 controls the respective portions of the power reception unit 23.

Figure 4:
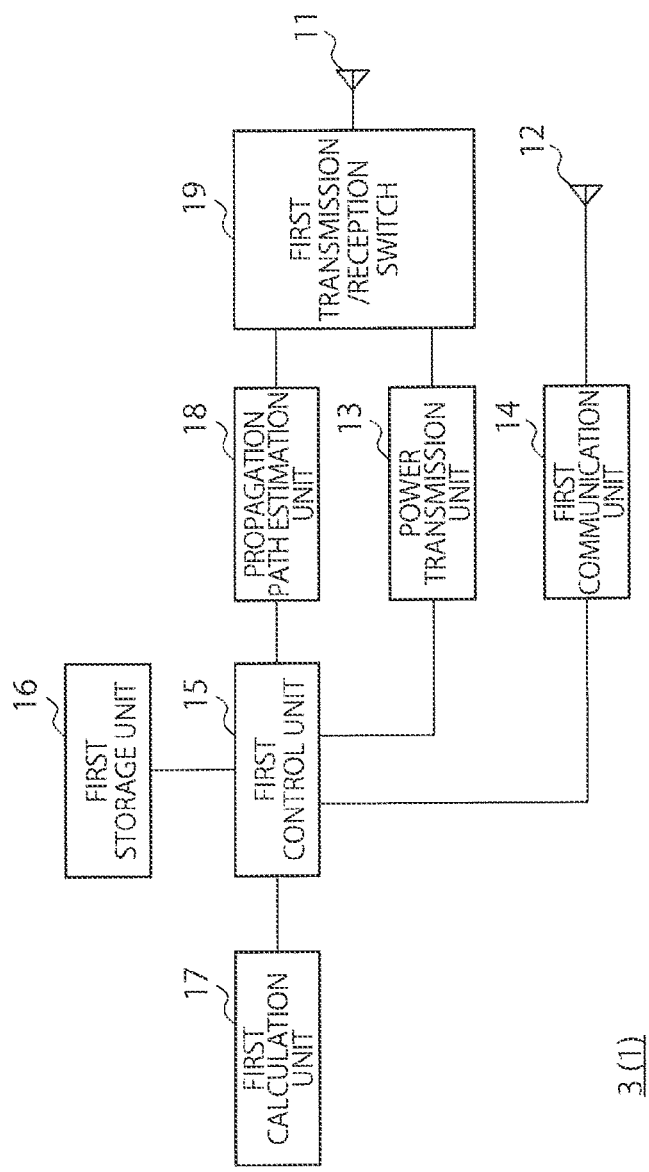
FIG. 4 is a block diagram of the power transmitter illustrating a modification example of FIG. 2.
Figure 5:
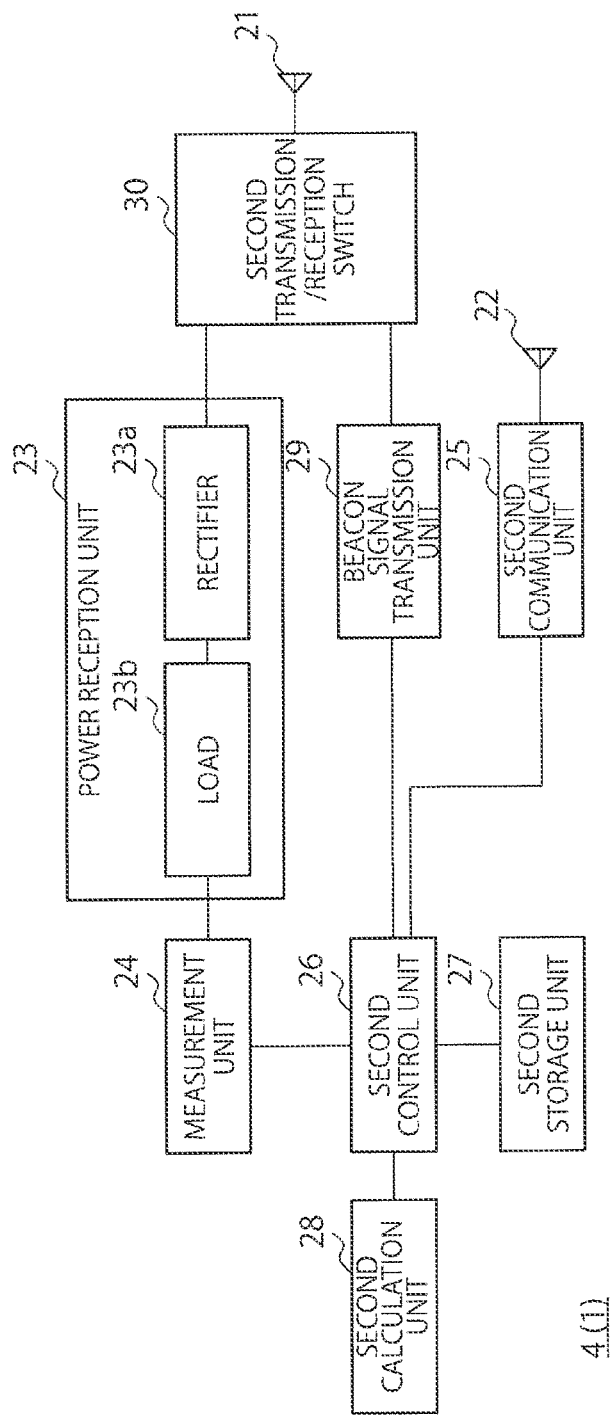
FIG. 5 is a block diagram of the power receiver illustrating a modification example of FIG. 3.

FIG. 4 is a block diagram of the power transmitter 3 illustrating a modification example of FIG. 2, and FIG. 5 is a block diagram of the power receiver 4 illustrating a modification example of FIG. 3. The power transmitter 3 illustrated in FIG. 2 and the power receiver 4 illustrated in FIG. 3 are internally configured not to estimate a propagation path. However, the power transmitter 3 illustrated in FIG. 4 and the power receiver 4 illustrated in FIG. 5 are internally configured to estimate a propagation path. The propagation path refers to a propagation path between the power transmitter 3 and each of the power receivers 4.

The power transmitter 3 illustrated in FIG. 4 has the same internal configuration as the power transmitter 3 illustrated in FIG. 2, and further includes a propagation path estimation unit (propagation path estimator) 18 and a first transmission/reception switch 19. The propagation path estimation unit 18 receives a beacon signal from the power receiver 4 and estimates the propagation path to the power receiver 4 based on the received beacon signal. The first transmission/reception switch 19 switches transmission and reception modes for the transmission of the radio waves and the estimation of the propagation path, respectively.

The power receiver 4 illustrated in FIG. 5 has the same internal configuration as the power receiver 4 illustrated in FIG. 3 and further includes a beacon signal transmission unit 29 and a second transmission/reception switch 30. The beacon signal transmission unit 29 transmits a beacon signal at the time of estimation of the propagation path. The second transmission/reception switch 30 switches transmission and reception modes for the transmission of the beacon signal for the estimation of the propagation path and the reception of radio waves from the one or more power transmitters 3, respectively.

As described above, the power transmitter 3 performs trial power transmission and actual power transmission. As methods for trial power transmission, there are batch feedback method and sequential feedback method. In the batch feedback method, the power transmitter 3 transmits continuously radio waves based on the plurality of power transmission patterns 5, and then receives collectively the receiving power information and required electric energy information from the plurality of power receivers 4. On the other hand, in the sequential feedback method, at each time of transmission of radio waves based on the individual power transmission patterns 5, the receiving power information and required electric energy information are received from the plurality of power receivers 4.

Figure 6:
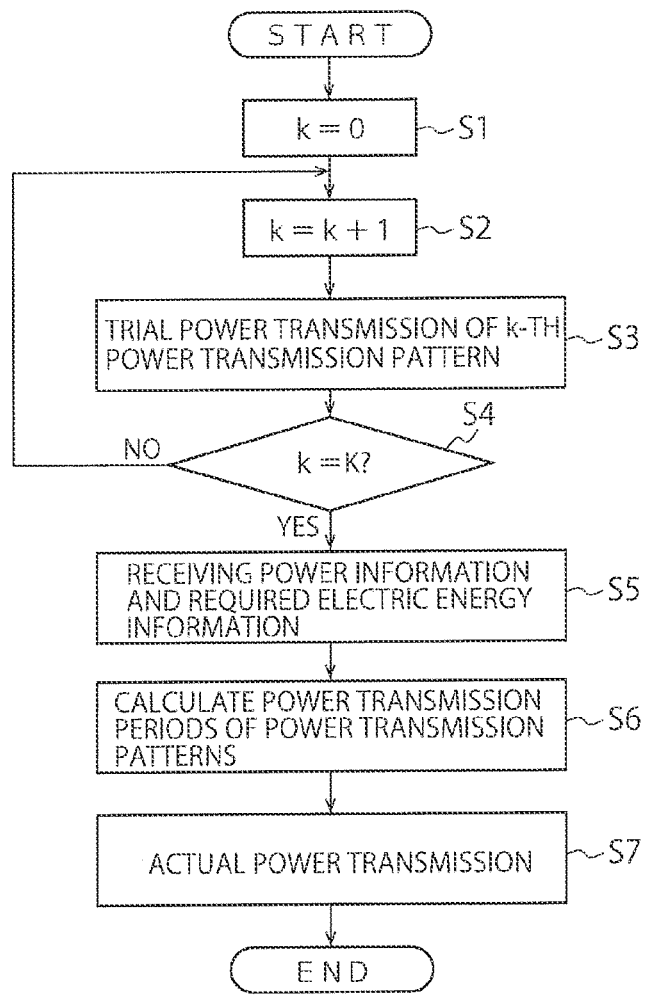
FIG. 6 is a flowchart illustrating an example of a procedure for a batch feedback method.
Figure 7:
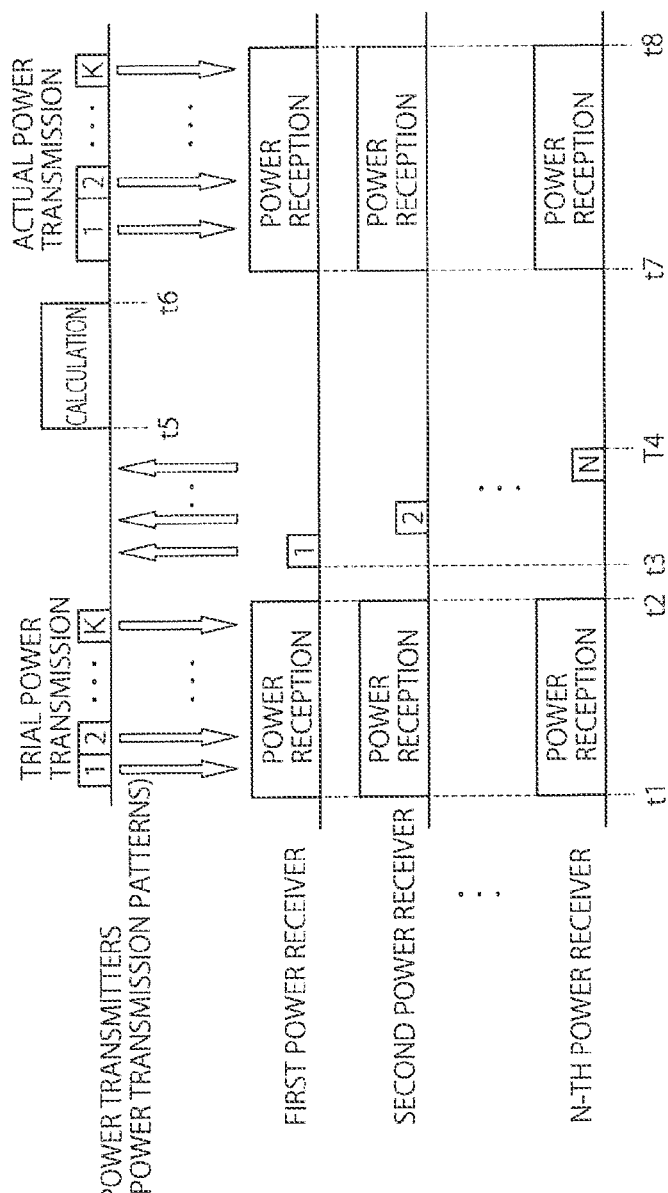
FIG. 7 is a timing chart for the batch feedback method.

FIG. 6 is a flowchart illustrating an example of a procedure for the batch feedback method, and FIG. 7 is a timing chart for the batch feedback method. The flowchart in FIG. 6 illustrates the procedure for processing by the one or more power transmitters 3. In steps S1 to S4 of FIG. 6, the power transmitter 3 performs continuously the trial power transmission of the radio waves based on the plurality of power transmission patterns 5. More specifically, first, a variable k indicating the kind of the power transmission pattern 5 is initialized to zero (step S1). Next, k is incremented by one (step S2). Then, the power transmitter 3 performs the trial power transmission of the radio wave based on the k-th power transmission pattern 5 (step S3). Then, the power transmitter 3 determines whether the variable k has reached maximum value K (step S4). When the variable k has not yet reached the maximum value K, the power transmitter 3 repeats step S2 and subsequent steps. Accordingly, as illustrated at times t1 to t2 illustrated in FIG. 7, the radio waves based on the plurality of power transmission patterns 5 is continuously transmitted. The transmission periods of the power transmission patterns 5 during the trial power transmission can be set arbitrarily. Each of the power receivers 4 receives the radio wave based on the power transmission patterns 5 and stores the receiving power information in the second storage unit 27.

When it is determined in step S4 that the variable k has reached K, each of the power receivers 4 transmits the receiving power information and the required electric energy information as illustrated at times t3 to t4 in FIG. 7. Each of the power transmitters 3 receives the receiving power information and the required electric energy information transmitted by each of the power receivers 4, and stores their information in the first storage unit 16 (step S5). The order in winch the plurality of power receivers 4 transmits the receiving power information and the required electric energy information can be set arbitrarily. In addition, the plurality of power receivers 4 may modulate the receiving power information and the required electric energy information at different frequency bands before transmission.

Next, the first calculation unit 17 calculates the transmission periods of the two or more power transmission patterns 5 based on the receiving power information and required electric energy information (step S6 in FIG. 6 and times t5 to t6 in FIG. 7). At this time, the first calculation unit 17 may also calculate various parameters other than the transmission periods.

Next, based on the results of the calculation in step S6, the power transmitter 3 performs the actual power transmission while switching between the two or more power transmission patterns 5 (step S7 in FIG. 6 and times t7 to t8 in FIG. 7). Accordingly, the power transmission patterns 5 of the power transmitter 3 are switched in each of the specific transmission periods (times t7 to t8 in FIG. 7). The one or more power transmitters 3 transmits the radio waves while switching between the transmission periods of the power transmission patterns 5 based on the receiving power information and the required electric energy information from the power receivers 4. Each of the power receivers 4 may monitor whether the radio waves from the actual power transmission have been received by the measurement unit 24 and provide the power transmitters 3 with information indicative of the monitoring results on a regular basis.

Figure 8:
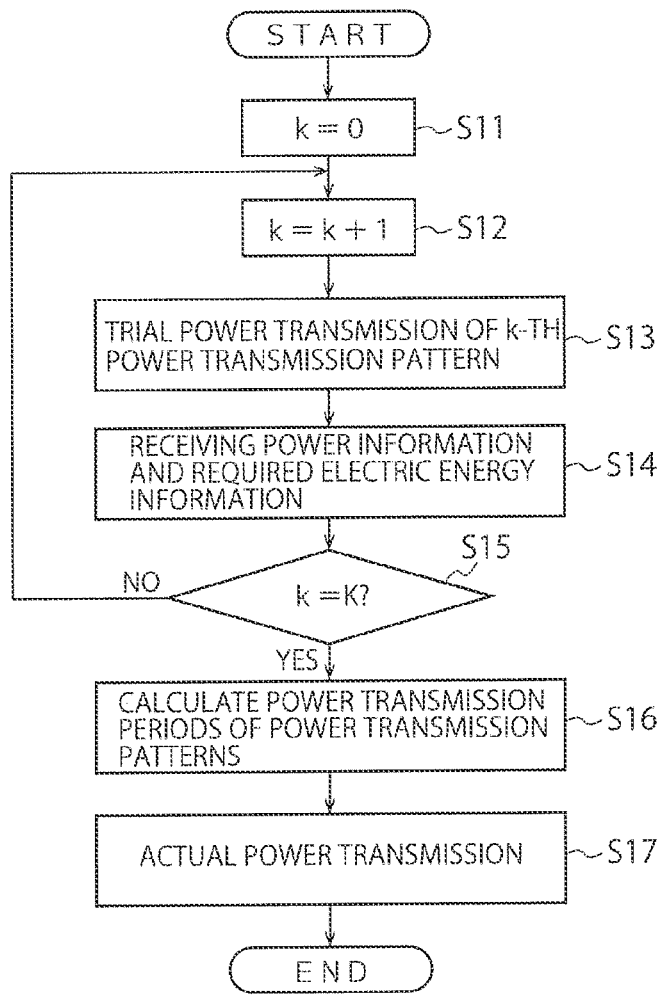
FIG. 8 is a flowchart illustrating an example of a procedure for a sequential feedback method.
Figure 9:
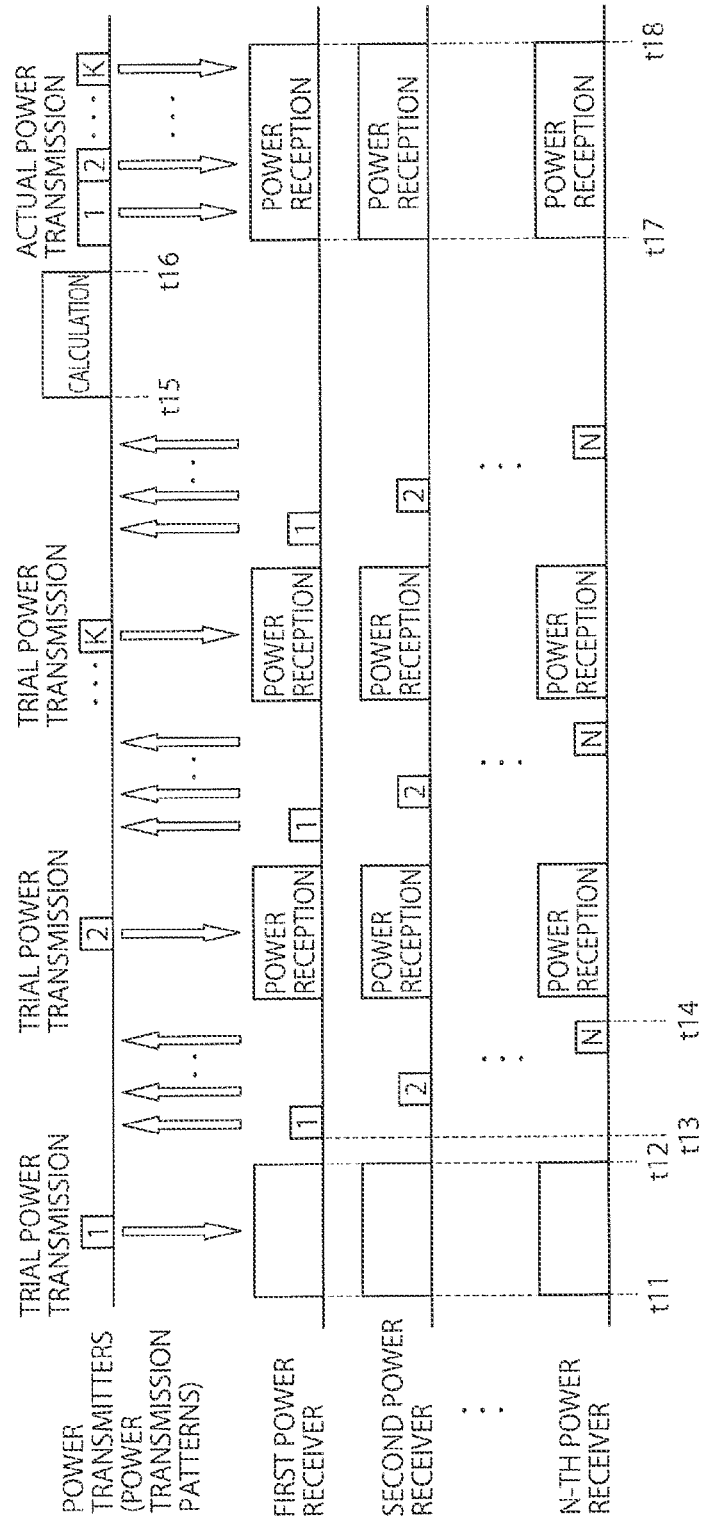
FIG. 9 is a timing chart for the sequential feedback method.

FIG. 8 is a flowchart illustrating an example of a procedure for the sequential feedback method, and FIG. 9 is a timing chart for the sequential feedback method. The flowchart in FIG. 8 illustrates the procedure for processing by the one or more power transmitters 3. Steps S11 to S13 are similar to steps S1 to S3 in FIG. 6. After performing the trial power transmission of the radio wave based on the k-th power transmission pattern 5 in step S13, the power transmitter 3 receives the receiving power information and the required electric energy information from the power receivers 4 having received the radio wave (step S14). The power transmitter 3 stores the received receiving power information and required electric energy information in the first storage unit 16. For example, times t11 to t12 in FIG. 9 corresponds to the trial power transmission period of the radio wave based on the first power transmission pattern 5, and times t13 to t14 corresponds to the period of reception of the receiving power information and the required electric energy information from the power receivers 4 having received the radio wave.

Next, the power transmitter 3 determines whether the variable k has reached K (step S15). When the variable k has not reached, the power transmitter 3 repeats step S12 and subsequent steps. When determining in step S15 that the variable k has reached K, the power transmitter 3 reads collectively the receiving power information corresponding to the power transmission patterns 5 and the required electric energy information from the first storage unit 16, and the first calculation unit 17 calculates the transmission periods of the two or more power transmission patterns 5 (step S16 in FIG. 8 and times t15 to t16 in FIG. 9). Next, based on the results of calculation in step S6, the power transmitter 3 performs the actual power transmission while switching between the two or more power transmission patterns 5 (step S17 in FIG. 8 and times t17 to t18 in FIG. 9).

In this way, in the batch feedback method, each of the power receivers 4 transmits collectively the information of the receiving power by the radio waves based on the plurality of power transmission patterns 5 and the required electric energy information to each of the power transmitters 3. Accordingly, each of the power transmitters 3 can receive collectively the receiving power information and the required electric energy information, and calculate the transmission periods of the power transmission patterns 5 immediately after the reception. On the other hand, in the sequential feedback method, each of the power receivers 4 transmits the information of the receiving power by the radio wave based on the power transmission patterns 5 and the required electric energy information to each of the power transmitters 3 at individual timings. Accordingly, each of the power transmitters 3 stores sequentially the receiving power information and the required electric energy information in the first storage unit 16 until all the information is received.

After reception of all the receiving power information and the required electric energy information, the power transmitter 3 calculates the transmission periods and parameters of the power transmission patterns 5.

Figures 10, 11:
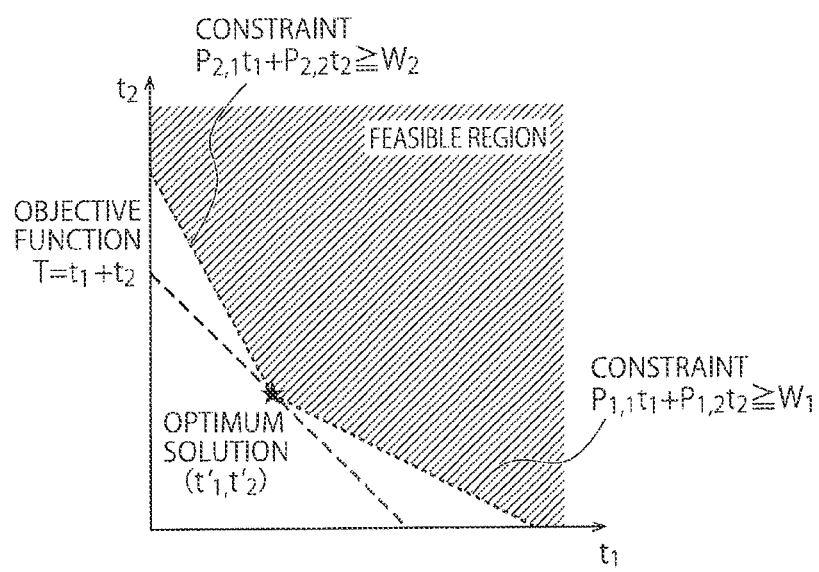
FIG. 10 is a diagram illustrating an example of a receiving power table that provides a summary of receiving power information and required electric energy information received by the power transmitter from the power receivers.
FIG. 11 is a diagram illustrating how to determine the optimum solution to a linear programming problem.

FIG. 10 is a diagram illustrating an example of a receiving power table 6 that provides a summary of receiving power information and required electric energy information received by the power transmitter 3 from the power receivers 4. This table is stored in the first storage unit 16. In the receiving power table 6 in FIG. 10, the identification numbers of the power receivers 4 are indicated in rows, and the identification numbers of the radio waves based on the power transmission patterns 5 are indicated in columns. The cells in the rows and columns record the corresponding receiving power. The cells in the last row record the transmission periods of the power transmission patterns 5 calculated by the first calculation unit 17. The cells in the last column record the required electric energies of the power receivers 4.

The first control unit 15 and the power transmission unit 13 in each of the power transmitters 3 perform actual power transmission with reference to the receiving power table 6 in FIG. 10.

Next, a method for calculating the transmission periods of the power transmission patterns 5 by the first calculation unit 17 will be described. When the transmission period of the actual power transmission based on the k-th power transmission pattern 5 is defined as $t_k$, the total time T in which power transmission based on the total K power transmission patterns 5 is expressed in the following equation (1):

$$T = \sum_{k=1}^{K} t_k = t_1 + t_2 + \ldots + t_K \quad (1)$$

where the time $t_k$ is a non-negative real number and thus $$t_k \geq 0 \ldots \quad (2).$$

Next, based on the receiving power table 6 in FIG. 10, the receiving power of the n-th power receiver 4 at the time of the trial power transmission of the k-th power transmission pattern 5 is defined as $p_{n,k}$. In order for the electric energy of the n-th power receiver 4 to meet required electric energy $W_n$, it is necessary to determine the transmission period $t_k$ satisfying the following equation (3):

$$\sum_{k=1}^{K} p_{n,k} t_k = p_{n,1} t_1 + p_{n,2} t_2 + \ldots + p_{n,K} t_K \geq W_n \quad (3)$$

In the equation (3), when $p_{n,k}$ is not zero, setting the transmission period $t_k$ to a large value would finally satisfy the required electric energy $W_n$. However, from the viewpoints of power saving and shortening the transmission period, the transmission period $t_k$, that is, the total time T is desirably as shorter as possible. Therefore, to satisfy the required electric energies of all the power receivers 4 in the shortest time, the minimization problem in the following equation (4) for the transmission period $t_k$ needs to be solved:

$$\text{Minimize } T = t_1 + t_2 + \ldots + t_K \quad (4)$$

$$\text{s.t.} \quad t_1, t_2, \ldots, t_K \geq 0$$

$$p_{1,1} t_1 + p_{1,2} t_2 + \ldots + p_{1,K} t_K \geq W_1$$
$$p_{2,1} t_1 + p_{2,2} t_2 + \ldots + p_{2,K} t_K \geq W_2$$
$$\ldots$$
$$p_{N,1} t_1 + p_{N,2} t_2 + \ldots + p_{N,K} t_K \geq W_N$$

As seen from the equation (4), the minimization problem in the equation (4) is a linear programming problem in which both an objective function and a constraint are expressed in linear form. FIG. 11 is a diagram illustrating how to find the optimum solution to a linear programming problem. FIG. 11 illustrates an example in which the number of power transmission patterns 5 is two and the number of the power receivers 4 is two. The shaded part in the drawing represents a feasible region where the constraint is satisfied. In a linear programming problem, the optimum solution exists at a vertex of a polygon representing a feasible region.

Figure 12:
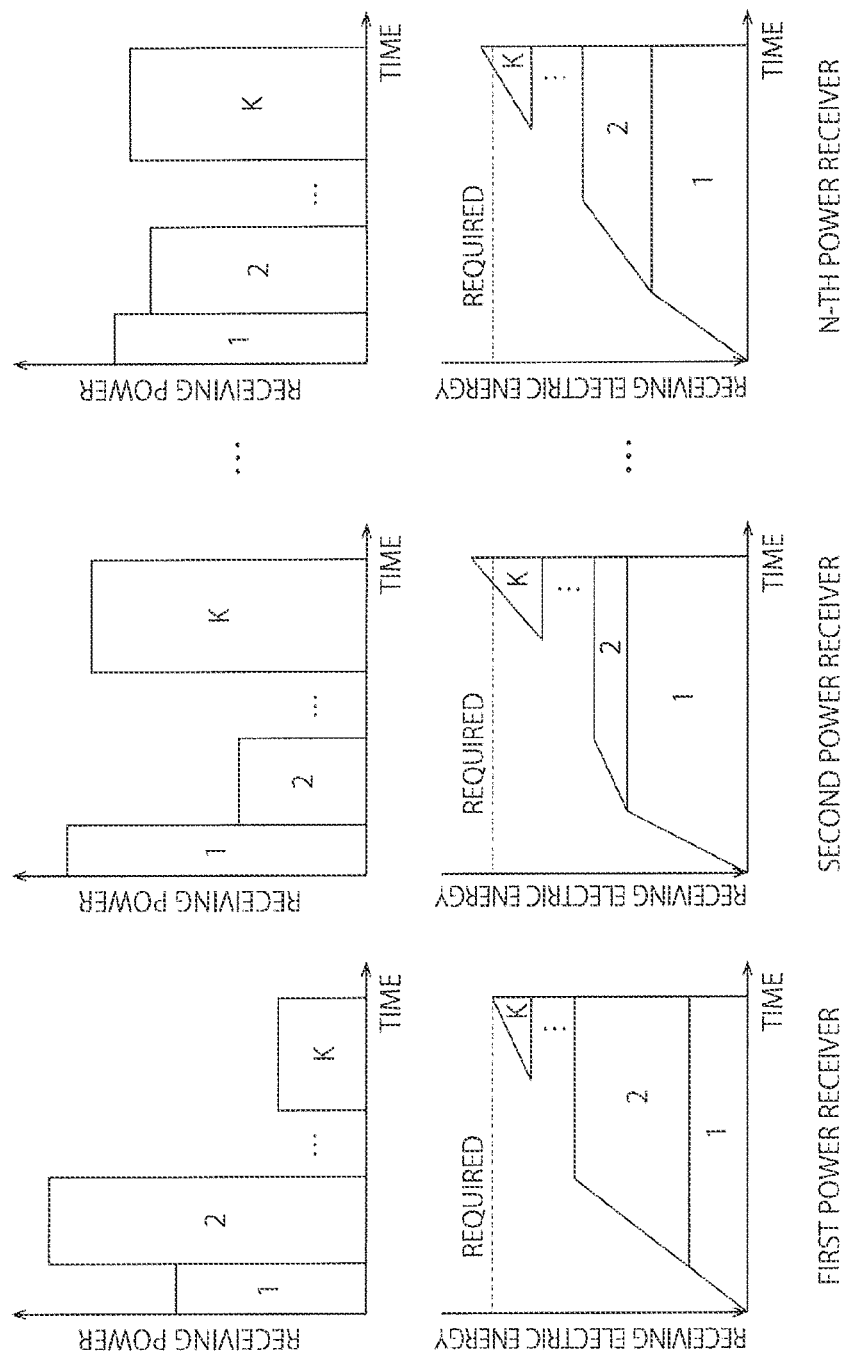
FIG. 12 is a diagram illustrating respective receiving power characteristics and receiving electric energy characteristics of the power receivers.

In the case of FIG. 11, when the objective function of the total time T indicated by a broken line is approached asymptotically to the origin point, the vertex ($t_1'$, $t_2'$) is the optimum solution where the total time T is the shortest. When the number of the power transmission patterns 5 is two and the number of the power receivers 4 is two, the optimum solution can be easily searched for in graph form as illustrated in FIG. 11. However, when the number of the power transmission patterns 5, that is, the variable is 3 or more, the feasible region is expressed in a polytope, and it is very difficult to determine the optimum solution by intuition. In this case, a global optimum can be efficiently found out by checking vertexes in the feasible region based on a specific rule using a simplex method. FIG. 12 illustrates the receiving power characteristics of the power receivers 4 with respect to time in the upper part and the receiving electric energy characteristics of the power receivers 4 with respect to time in the lower part, in the case where actual power transmission is performed based on the results of calculation by the first calculation unit 17.

As for the receiving power characteristics in the upper part of FIG. 12, when there is no fluctuation in the radio wave propagation environment and the positions of the power receivers 4, the receiving power during transmission of the radio wave based on the same power transmission pattern 5 is constant. When the switching of the power transmission patterns 5 takes place, the receiving power varies depending on the power transmission pattern 5.

As for the receiving electric energy characteristics in the lower part of FIG. 12, the gradients in the graphs of the receiving electric energies with respect to time are constant during the transmission of the radio wave based on the same power transmission pattern 5. When the power transmission patterns 5 are switched, the gradients in the graphs of the receiving electric energies vary. The broken lines in the lower part of FIG. 12 indicate the required electric energies. The transmission periods of the power transmission patterns 5 are set such that, upon transmission of the radio wave based on the last K-th power transmission pattern 5, the receiving electric energies of the all power receivers 4 reach or exceed the broken line levels.

Figure 13:
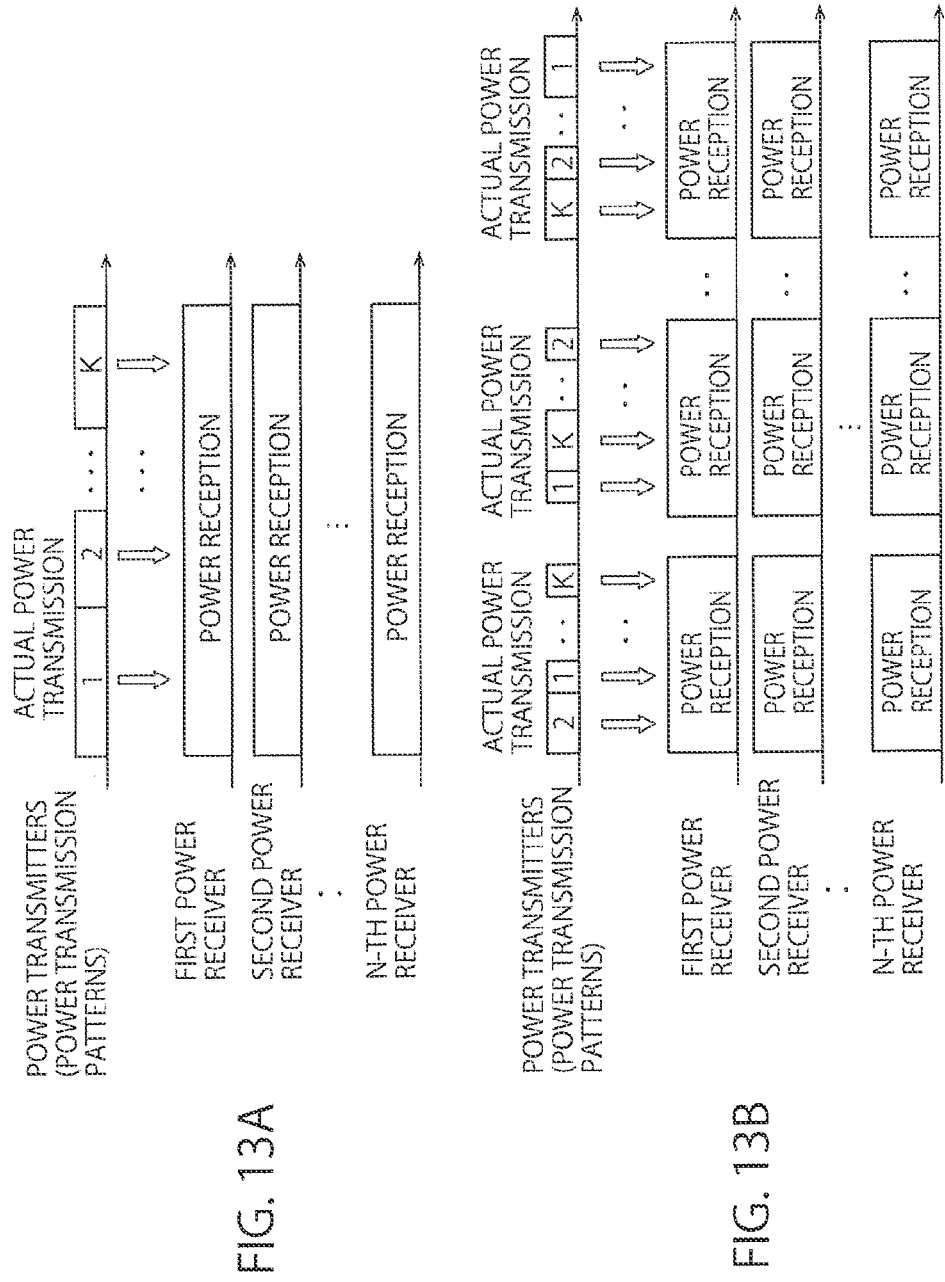
FIG. 13A is a diagram illustrating an example of radio wave transmission in numerical order.
FIG. 13B is a diagram illustrating an example of radio wave transmission in arbitrary order.

FIG. 12 illustrates an example in which the radio waves based on the power transmission patterns 5 are transmitted in numerical order from the first power transmission pattern 5 to the K-th power transmission pattern 5. However, the power transmission patterns 5 may be transmitted in arbitrary order. FIG. 13A illustrates an example of transmission of radio waves based on the power transmission patterns 5 in numerical order, and FIG. 13B illustrates an example of transmission of radio waves based on the power transmission patterns 5 in arbitrary order. The radio waves based on the power transmission patterns 5 do not necessarily need to be collectively transmitted but each of the power transmission patterns 5 may be divided by a plurality of transmission periods so that the divided power transmission patterns 5 are transmitted in arbitrary power transmission order as illustrated in FIG. 13B.

First Modification

The radio wave is desirably transmitted from the one or more power transmitters 3 to the plurality of power receivers 4 in as short time as possible. Specifically, the radio waves are desirably transmitted from each of the power transmitters 3 to the plurality of power receivers 4 while switching between the two or more power transmission patterns 5 such that the required electric energy of the power receivers 4 can be satisfied within a predetermined time. As methods for setting the predetermined time, there are a first method and a second method as described below.

In the first method, when all K power transmission patterns 5 are transmitted in an equal power transmission period $t_{equal}$, a minimum time $T_{1,min}$ needed to meet the required electric energies of all N power receivers 4 is the predetermined time. When the total time is defined as T1, the transmission period $t_{equal}$ equally allocated to all the K power transmission patterns 5 is expressed by the following equation (5):

$$t_{equal} = \frac{T_1}{K} \qquad (5)$$

According to the foregoing equation (3), when the power transmission patterns 5 are transmitted in the equal transmission period $t_{equal}$, the receiving electric energy of the n-th power receiver 4 is expressed by the left-hand side of the equation (6) shown below. The receiving electric energy needs to be equal to or larger than required electric energy $W_n$ of the n-th power receiver 4 expressed by the right-hand side of the equation (6):

$$t_{equal} \sum_{k=1}^{K} p_{n,k} \geq W_n \qquad (6)$$

Therefore, the minimum time $T_{1,min}$ for meeting all the required electric energies of all the N power receivers 4 is expressed by the following equation (7):

$$T_{1,min} = K \max\left( \frac{W_1}{\sum_{k=1}^{K} p_{1,k}}, \frac{W_2}{\sum_{k=1}^{K} p_{2,k}}, \ldots, \frac{W_N}{\sum_{k=1}^{K} p_{N,k}} \right) \qquad (7)$$

The term max( ) in the equation (7) indicates the maximum value of the vector in ( ).

In the second method, the predetermined time is defined as the minimum time $T_{2,min}$ to satisfy the required electric energies of the all N power receivers 4 under the assumption that each of the power receivers 4 feedbacks the information of the receiving power only by the power transmission pattern 5 which yields the maximum receiving power at the respective power receiver 4 to the power transmitter 3.

When a maximum receiving power $p_{n,k}$ has been obtained from the k-th power transmission pattern 5 in the n-th power receiver 4, the shortest time $t_{n,k}$ satisfying the required electric energy $W_n$ of the n-th power receiver 4 is determined by the following equation (8):

$$t_{n,k} = \frac{W_n}{p_{n,k}} \qquad (8)$$

In the case that the maximum receiving power has been obtained by the k-th power transmission pattern 5 in two or more of the plurality of power receivers 4, the transmission period $t_{k,min}$ of the k-th power transmission pattern 5 is set to the longest one of the minimum times $t_{n,k}$ satisfying the required electric energies of the corresponding power receivers 4 calculated in the equation (8). As for the power transmission pattern 5 not selected by any of the power receivers 4, the time $t_{k,min}$ is set to zero and this power transmission pattern 5 is not used in the actual power transmission. According to the foregoing equation (3), the receiving electric energy of the n-th power receiver 4 in the case of transmitting the k-th power transmission pattern 5 in the transmission period $t_{k,min}$ is expressed by the left-hand side of the equation (9) shown below. The receiving electric energy needs to be equal to or larger than the required electric energy $W_n$ of the n-th power receiver 4 expressed by the right-hand side of the equation (9):

$$\sum_{k=1}^{K} p_{n,k} t_{k,min} \geq W_n \qquad (9)$$

In the above, the transmission period $t_{k,min}$ of the k-th power transmission pattern 5 is defined in advance to meet the required electric energies $W_n$ of all the power receivers 4. Accordingly, in actuality, the value of the left-hand side of the equation (9) could be excessively larger than the value of the right-hand side of the equation (9). Therefore, a scale factor $s_n$ is introduced and defined by the following equation (10):

$$s_n = \frac{\sum_{k=1}^{K} p_{n,k} t_{k,min}}{W_n} \qquad (10)$$

Minimum value $s_{min}$ of the scale factor $s_n$ to all the power receivers 4 is expressed by the following equation (11):

$$s_{min} = \min(s_1, s_2, \ldots, s_N) \qquad (11)$$

The term min( ) in the equation (11) indicates the minimum value of the vector in ( ). Specifically, the transmission period $t_{k,min}$ of the k-th power transmission pattern 5 is divided by the minimum scale factor $s_{min}$ to determine a total minimum time $T_{2,min}$ satisfying the required electric energies $W_n$ of all the power receivers 4. From the foregoing matter, the minimum time $T_{2,min}$ is expressed by the following equation (12):

$$T_{2,min} = \frac{\sum_{k=1}^{K} t_{k,min}}{s_{min}} \quad (12)$$

Second Modification

The power transmission antenna 11 of the power transmitter 3 may be a phased array antenna. The phased array antenna has a plurality of antenna elements and a variable phase shifter connected to these antenna elements. The variable phase shifter can control the phases of radio waves input into the antenna elements to generate arbitrary power transmission patterns 5. The phased array antenna may have a variable amplifier in addition to the variable phase shifter. Providing a variable amplifier makes it possible to control the amplitudes of radio waves and suppress radiation of power in unnecessary directions, thereby allowing generation of power transmission patterns 5 with higher degrees of freedom.

Third Modification

Radio waves for use in power transmission are desirably non-modulated continuous waves from the viewpoints of improving the power transmission efficiency and reducing interference with other wireless facilities. In addition, the radio waves for use in power transmission and the radio waves for use in communications are desirably different in frequency so as not to hinder communications between the power receivers 4. This allows power transmission from the power transmitters 3 and transmission of the receiving power information from the power receivers 4 simultaneously without interference.

Fourth Modification

The method for controlling the transmission periods assigned to the plurality of prepared power transmission patterns 5 has been described so far. However, the power transmission patterns 5 may be variably controlled.

For example, like the power transmitter 3 illustrated in FIG. 4 and the power receiver 4 illustrated in FIG. 5, the power transmission patterns 5 may be decided based on the propagation path information between the power transmitter 3 and the power receiver 4. More specifically, singular vectors on the power transmission side obtained by singular value decomposition of a propagation path matrix between the plurality of power transmitters 3 and the plurality of power receivers 4 are equivalent to phase and amplitude information of radio waves input into the power transmission antennas of the power transmitters 3 (hereinafter, called weights). In particular, the weight corresponding to the maximum singular value generates the power transmission pattern 5 by which the sum of alternating-current power received by all the power receivers 4 is maximized. However, this weight may not maximize the sum of direct-current power received by all the power receivers 4 due to non-linearity of rectification efficiency of the rectifiers 23a of the power receivers 4. In addition, the weights corresponding to the non-zero singular values are capable of supplying power to the power receivers 4 but the weights corresponding to the zero singular values are not capable of supplying power. Therefore, the weights corresponding to the zero singular value should not be used for power transmission patterns 5. One or more of the weights corresponding to the non-zero singular values can be used as power transmission patterns 5.

Moreover, in order to concentrate a transmission power to one specific power receiver 4, the weight given as a complex conjugate of a propagation path vector for this power receiver 4 can be used. This method is widely known as retro-directive method. Therefore, one or more of the retro-directive weights for the respective power receivers 4 can be used as power transmission patterns 5.

The foregoing weights may not be strictly reproduced depending on the resolutions of the variable phase shifter and the variable amplifier and the dynamic range of the variable amplifier. In this case, pseudo weights that are rounded to settable phase values or amplitude values close to ideal weights or in which the upper and lower limits of the amplitude are clipped or compressed to fall within the dynamic range can be used.

Fifth Modification

When none of the power transmitters 3 and the power receivers 4 has a propagation path estimation function as the power transmitter 3 illustrated in FIG. 2 and the power receiver 4 illustrated in FIG. 3, it is difficult to determine the power transmission patterns 5 based on the propagation path information described above in relation to the fourth modification. Instead of deciding the power transmission patterns 5 from the propagation path information, the power transmission patterns 5 can be decided based on relative position or direction information of the power receivers 4 to the power transmitters 3. For example, in in-door environments such as commercial facilities and factories, surveillance cameras or the like (power receiver localization units) are arranged so that the location information of the power receivers 4 can be obtained from image information provided by the cameras. In outdoors, the locations of the power receivers 4 can be roughly specified by the GPS. Besides, a radar or the like separately installed on the transmission side can receive signals used for communication by the power receiving side to acquire the location information.

With a phased array consisting of the power transmission antennas 11 arranged one-dimensionally or two-dimensionally at equal spaces, the traveling direction of the wave front can be controlled by giving appropriate phase differences to the radio waves input into the power transmission antennas 11 and transmission power can be concentrated to a specific direction. In this way, one or more power transmission patterns 5 based on the location or direction information can be used for the power receivers 4 without a propagation path estimation function.

In this way, in the present embodiment, based on the receiving power information and the required electric energy information from the plurality of power receivers 4, the transmission periods of the two or more power transmission patterns 5 are calculated, and these power transmission patterns 5 are transmitted while switching between the calculated transmission periods. This makes it possible to transmit radio waves meeting the required electric energies from the plurality of power receivers 4. In the present embodiment, the power transmitter 3 performs trial power transmission and actual power transmission. In the trial power transmission, the radio waves based on the plurality of power transmission patterns 5 are continuously transmitted, and the plurality of power receivers 4 having received these radio waves transmits the receiving power information and the required electric energy information. Accordingly, the power transmitter 3 can receive the receiving power information and the required electric energy information to calculate the transmission periods of the two or more power transmission patterns 5 for use in the actual power transmission. In this way, adjusting the transmission periods of the two or more power transmission patterns 5 allows the plurality of power receivers 4 to receive the required electric energies within a predetermined time.

Second Embodiment

In the wireless power transmission device 1 according to the first embodiment, each power receiver 4 transmits to the power transmitters 3 the receiving power information per trial power transmission pattern for all of a plurality of trial power transmission patterns. However, as the number of trial power transmission patterns are larger, the number of times for each power receiver 4 to transmit the receiving power information to the power transmitter 3 increases, so that the power consumption of each power receiver 4 increases. Essentially, it is desirable that only the power receivers 4 for which feeding efficiency by the trial power transmission patterns is high transmit the receiving power information to the power transmitters 3. Accordingly, in the second embodiment, the power receivers 4 for which feeding efficiency by the trial power transmission patterns is low are not allowed to transmit the receiving power information to the power transmitter 3.

Figure 14:
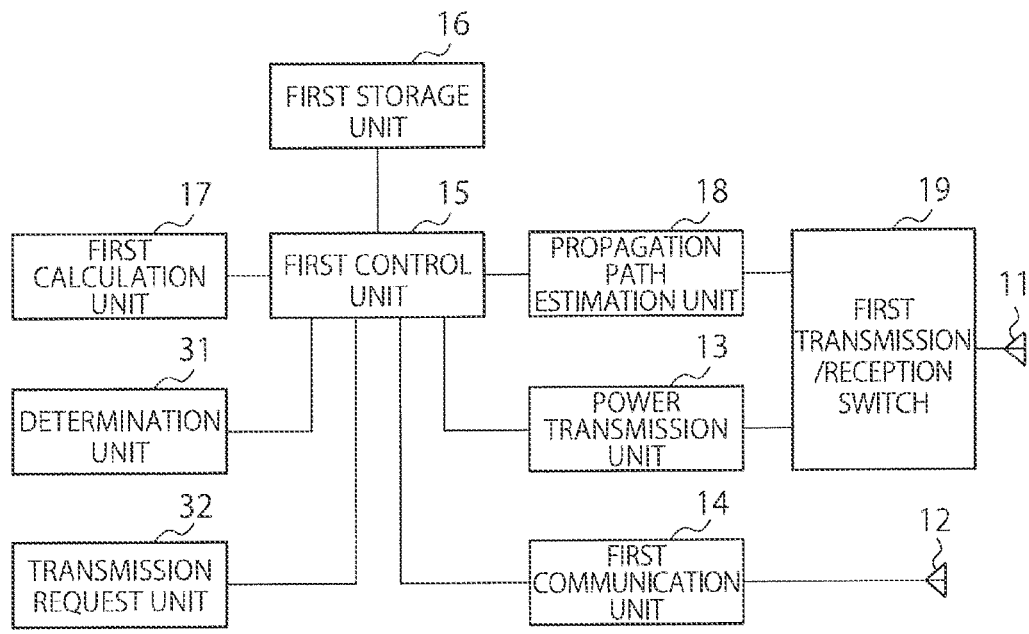
FIG. 14 is a block diagram illustrating a schematic configuration of a wireless power transmission device according to a second embodiment.

FIG. 14 is a block diagram illustrating a schematic configuration of a wireless power transmission device 1 according to a second embodiment and illustrating a block configuration of a power transmitter 3. The power transmitter 3 illustrated in FIG. 14 has the same configuration as the power transmitter 3 illustrated in FIG. 4, and further includes a determination unit 31 and a transmission request unit 32.

The determination unit 31 determines per power receiver 4 whether the transmission of receiving power information from a plurality of power receivers 4 is required, based on at least one of propagation path information of the power receivers 4 and arrangement information of the power receivers 4, and on power transmission pattern information to the power receivers 4. The transmission request unit 32 requests a power receiver 4 for which the transmission of receiving power information has been determined as required by the determination unit 31 to transmit the receiving power information and the required electric energy information required by that power receiver 4.

As a specific procedure for the determination unit 31, two ways of a first procedure and a second procedure are considered.

In the first procedure, it is determined per power receiver 4 whether the transmission of receiving power information and required electric energy information from the plurality of power receivers 4 is required, based on a value obtained by multiplying the propagation path information of the power receivers 4 and the power transmission pattern information to the power receivers 4.

The power transmission pattern information to the plurality of power receivers 4 can be expressed with phase and amplitude information (weight) of radio waves input into a plurality of power transmission antennas 11 of a power transmitter 3. It is defined that the power transmission antennas 11 of the power transmitter 3 are a phased array antenna having M elements in total and an m-th component (m=1 . . . M) of a propagation path vector to an n-th (n=1 . . . N) power receiver 4 among N power receivers 4 in total is $h_{n,m}$ which corresponds to a propagation path coefficient between the n-th power receiver 4 and the m-th element of the phased array antenna. It is also defined that the m-th component of a weight corresponding to a k-th power transmission pattern is $w_{k,m}$ which corresponds to phase and amplitude information of radio waves input into the m-th element of the phased array antenna. A complex correlation coefficient $p_{n,k}$ of a weight corresponding to the propagation path vector and the k-th power transmission pattern to the n-th power receiver 4 are expressed by the following equation (13):

$$\rho_{n,k} = \frac{\sum_{m=1}^{M} h_{n,m} w_{k,m}}{\sqrt{\sum_{m=1}^{M} |h_{n,m}|^2} \sqrt{\sum_{m=1}^{M} |w_{k,m}|^2}} \quad (13)$$

In estimation of correlation, a value obtained by squaring the absolute vale of the complex correlation coefficient $p_{n,k}$ expressed by the equation (13) is often used. When $|p_{n,k}|^2$ is equal to or larger than a predetermined value, it is determined that the transmission of receiving power information from a power receiver 4 is required. In general, in the case that $|p_{n,k}|^2$ is equal to or larger than 0.5, it is determined that the correlation is high. Therefore, the predetermined value may be 0.5 or another value.

Figure 15:
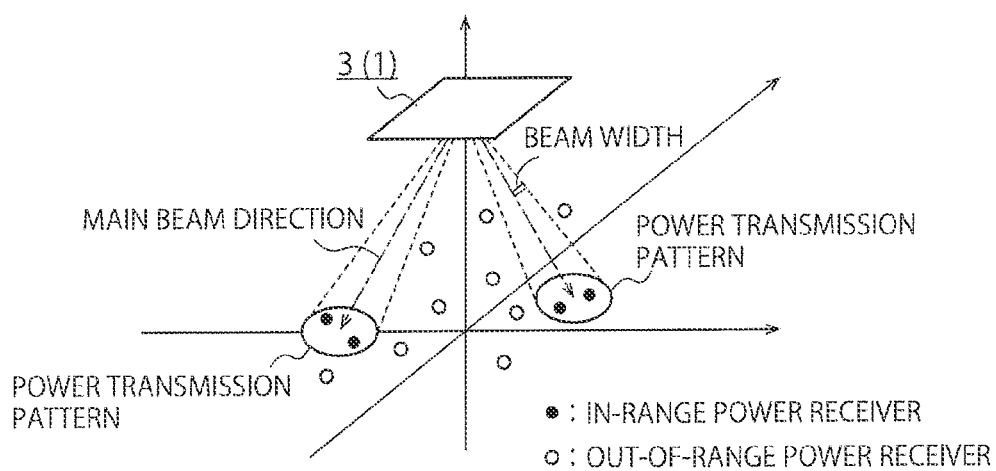
FIG. 15 is a diagram illustrating the direction and beam width of power transmission patterns and the installation locations of power receivers.

In the second procedure, the determination unit 31 determines per power receiver 4 whether the transmission of receiving power information and required electric energy information from the plurality of power receivers 4 are required, based on the arrangement information of the power receivers 4 and the power transmission pattern information to the power receivers 4. The arrangement information (relative position information) of the power receivers 4 can be acquired from a camera, GPS, radar, etc. as described above. The power transmission pattern information includes, for example, as illustrated in FIG. 15, information on a main beam direction (main robe) and a beam width of a power transmission pattern. The determination unit 31 compares the relative position information of the power receivers 4 and the main beam direction and beam width of the power transmission pattern to determine whether the power receivers 4 are located within the main beam range of the power transmission pattern. For the predetermined beam width, for example, an angular width having 3 dB reduced from the maximum gain, so-called a half-value angle, may be employed. The power receivers 4 located within the main beam range of the power transmission pattern is determined that the transmission of receiving power information is required.

Although the main beam direction and beam width of the power transmission pattern can be acquired by preliminary measurements, it is practically impossible to perform the measurements to all of assumed power transmission patterns. Therefore, values calculated with simulation may be used as the main beam direction and beam width of the power transmission pattern. As for the simulation, it is not always necessary to use an electromagnetic field simulator. Those values can be calculated by a general-purpose computer based on directivity (also referred to as an element factor) of a single antenna used as each element of the phased array antenna and arrangement coordinates information and weight information (also referred to as an array factor) of each element of the phased array antenna.

In the above description, the procedure for determining whether the transmission of receiving power information from each power receiver 4 is required has been described. However, a power transmission pattern by which a group of predetermined two or more power receivers 4 satisfies a predetermined determination criterion may be decided and transmitted to the group of power receivers 4. As for the classification to groups of power receivers 4, by using various clustering methods with variables such as a complex correlation coefficient between propagation path vectors of two power receivers 4 obtained by the equation (13) and coordinates information (for example, x-, y-, z-coordinates in the orthogonal coordinates) of each power receiver 4, the power receivers 4 can be classified into a plurality of power receiver groups of power receivers 4 that have "a high correlation" with each other or that are "physically close" to each other. As typical clustering methods, Ward's method as a hierarchical method, K-means clustering as a nonhierarchical method, etc. are listed.

Then, for example, as described above, a power transmission pattern can be nominated based on weights (especially, a weight corresponding to the maximum singular value) obtained by singular value decomposition of a propagation path matrix to a plurality of power receivers 4 in each group of power receivers 4.

Figure 16:
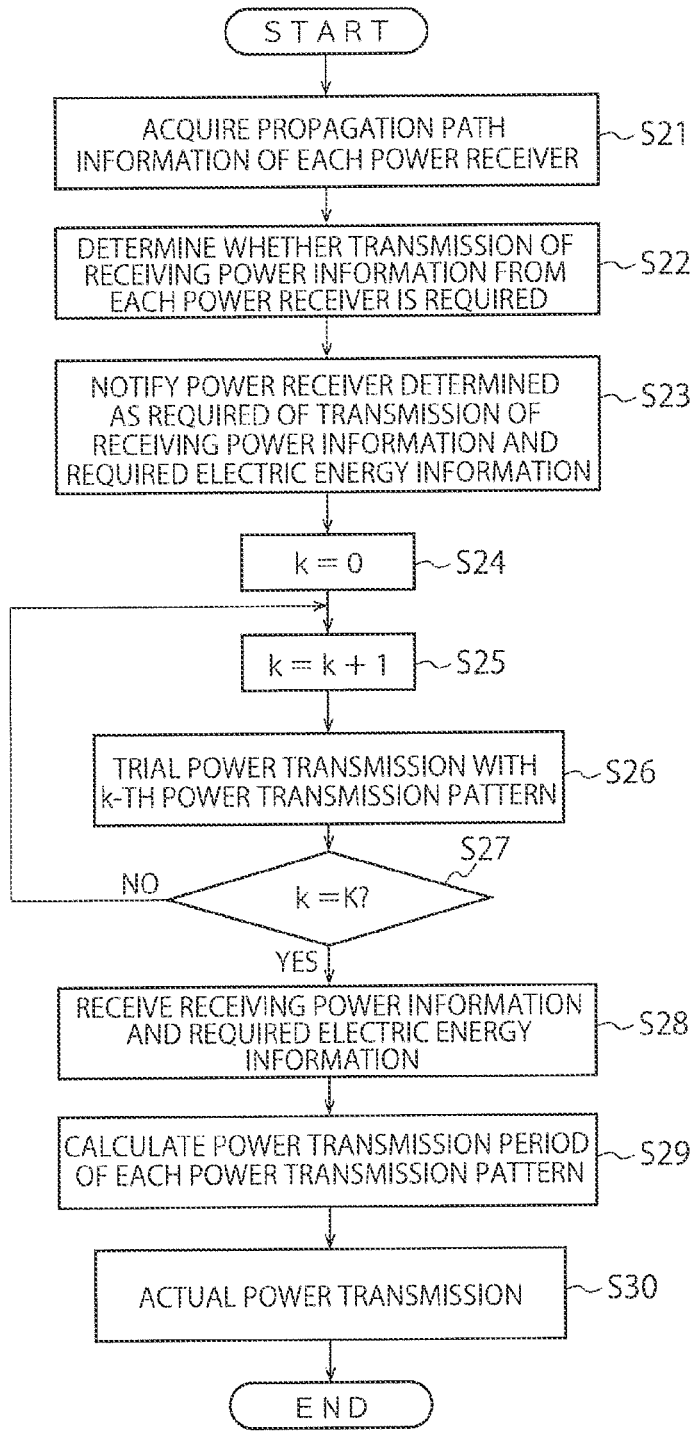
FIG. 16 is a flowchart illustrating a procedure for a power transmitter according to the second embodiment.

FIG. 16 is a flowchart illustrating a procedure for the power transmitter 3 according to the second embodiment. This flowchart illustrates a procedure for a batch feedback method similar to that of FIG. 6. First, propagation path information of each power receiver 4 is acquired (step S21). Here, for example, a beacon signal transmitted from each power receiver 4 is received and, in the propagation path estimation unit 18 of the power transmitter 3, propagation path information between the power transmitter 3 to each power receiver 4 is estimated.

Next, it is determined by the determination unit 31 whether the transmission of receiving power information from each power receiver 4 is required (step S22). Here, in the above-described first or second procedure, it is determined whether the transmission of receiving power information from each power receiver 4 is required.

Next, to the power receiver 4 which is determined as requiring the transmission of receiving power information, the transmission of receiving power information and required electric energy information is notified (step S23). This notification is made, for example, via the first communication unit 14.

Thereafter, similar to steps S1 to S7 of FIG. 6, the trial power transmission, the reception of receiving power information and required electric energy information, and the actual power transmission are performed one by one (steps S24 to S30). When the sequential feedback method is employed, in steps S24 to S30 of FIG. 16, steps S11 to S17 of FIG. 8 are performed.

As described above, in the second embodiment, based on at least one of the propagation path information of the plurality of power receivers 4 and the arrangement information of the power receivers 4, and the power transmission pattern information to the power receivers 4, whether the transmission of receiving power information from the power receivers 4 is required is determined per power receiver 4. Accordingly, it is enough that, per power transmission pattern, only the power receivers 4 for which feeding efficiency is high transmit the receiving power information and the required electric energy information to the power transmitter 3, so that the power consumption of each power receiver 4 is reduced and the number of pieces of information such as the receiving power information to be received by the power transmitter 3 is also reduced, and hence the processing load of the power transmitter 3 can be decreased.

The procedure for each component in the power transmitter 3 according to each of the above-described embodiments can be executed by one or more signal processors. Moreover, the power transmitter 3 may be configured with SoC (System on Chip) having one or more signal processors and memories integrated together.

At least part of the wireless power transmission devices 1 and the wireless power transmission system 2 described above in relation to the embodiment may be formed by hardware or software. In the case of forming by software, programs for implementing the functions of at least some of the wireless power transmission devices 1 and the wireless power transmission system 2 may be stored in a recording medium such as a flexible disc or a CD-ROM and read and executed by a computer. The recording medium is not limited to a detachable one such as a magnetic disc or an optical disc but may be a fixed recording medium such as a hard disc device or a memory.

In addition, the programs for implementing the functions of at least part of the wireless power transmission devices 1 and the wireless power transmission system 2 may be distributed via a communication line such as the internet (including wireless communication). Further, the programs may be distributed via a wired line or a wireless line such as the internet or through a recording medium in an encrypted, modulated, or compressed state.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An electronic apparatus that transmits wireless power by a radio wave to a first power receiver and a second power receiver through a plurality of power transmission patterns, the plurality of power transmission patterns including main beams, the electronic apparatus comprising:

determination circuitry configured to
compare position information of the first power receiver and the second power receiver with directions of the main beams of the plurality of the power transmission patterns and beam widths of the main beams of the plurality of the power transmission patterns, the directions of the main beams and the beam widths of the main beams being in specific predetermined ranges and acquired by at least one of preliminary measurements or simulation, and
determine, after the comparison, whether the first power receiver and the second power receiver are in the main beams of the plurality of the power transmission patterns;

a calculator configured to calculate a minimum total time of a first power transmission period and a second power transmission period for which power amounts requested by the first and second power receivers are satisfiable using a first power transmission pattern and a second power transmission pattern, the plurality of power transmission patterns including the first power transmission pattern and the second power transmission pattern,
    wherein the minimum total time is determined by minimizing a sum of the first power transmission period and the second power transmission period,
    wherein the first power transmission period is a time length where each receiver receives the first power transmission pattern,
    wherein the second power transmission period is a time length where each receiver receives the second power transmission pattern,
    wherein a sum of each power transmission pattern received by the first power receiver satisfies a power amount in watt hours requested by the first power receiver, and
    wherein a sum of each power transmission pattern received by the second power receiver satisfies a power amount in watt hours requested by the second power receiver,
a power transmitter configured to transmit a first radio wave by the first power transmission pattern within the first power transmission period and a second radio wave by the second power transmission pattern within the second power transmission period;
a controller configured to control transmission of a plurality of radio waves, the plurality of radio waves including the first radio wave and the second radio wave; and
a communicator configured to:
    receive information of each power transmission pattern and the power amount requested by the first power receiver, and
    receive information of each power transmission pattern and the power amount requested by the second power receiver.

2. The electronic apparatus according to claim 1, wherein the controller is further configured to control transmission of a direction of the first radio wave, a phase of the first radio wave, an amplitude of the first radio wave, a direction of the second radio wave, a phase of the second radio wave, and an amplitude of the second radio wave.

3. The electronic apparatus according to claim 1, wherein wireless power meeting the power amount requested by the first power receiver and the power amount requested by the second power receiver is transmitted to the first power receiver and the second power receiver within a predetermined time period.

4. The electronic apparatus according to claim 1, wherein the power transmitter divides the first power transmission period and the second power transmission into a plurality of power transmission division periods, and transmits power while switching the first power transmission pattern and the second power transmission pattern in accordance with the power transmission division periods.

5. The electronic apparatus according to claim 1, further comprising:
    a phased array antenna that includes a plurality of antennas that transmit and receive a radio wave between the first power receiver and the second power receiver, and a variable phase shifter connected to the plurality of antennas, the variable phase shifter generating the plurality of power transmission patterns by variably controlling a phase of a high frequency signal in accordance with the radio wave.

6. The electronic apparatus according to claim 1, wherein the first radio wave and the second radio wave are non-modulated continuous waves, and
    frequencies of the first radio wave and the second radio wave are different from a frequency of the radio wave used when the first power receiver transmits the information of each power transmission pattern and the power amount requested by the first power receiver and a frequency of the radio wave used when the second power receiver transmits the information of each power transmission pattern and the power amount requested by the second power receiver.

7. The electronic apparatus according to claim 1, further comprising:
    a propagation path estimator configured to estimate a first propagation path between the first power receiver and the electronic apparatus and estimate a second propagation path between the second power receiver and the electronic apparatus, wherein
    at least one of the first power transmission pattern and the second power transmission pattern is generated from the first propagation path and the second propagation path.

8. The electronic apparatus according to claim 1, further comprising:
    power receiver localization circuitry that detects at least one of locations and directions of the first power receiver and the second power receiver, wherein
    at least one of the first power transmission pattern and the second power transmission pattern is generated from at least one of locations and directions of the first power receiver and the second power receiver.

9. The electronic apparatus according to claim 1, wherein at least some of the directions of the main beams and the beam widths of the main beams are acquired by the preliminary measurements.

10. A wireless power transmission method of transmitting radio waves based on a plurality of power transmission patterns to a first power receiver and a second power receiver, the plurality of power transmission patterns including main beams, the wireless power transmission method comprising:
    comparing position information of the first power receiver and the second power receiver with directions of the main beams of the plurality of the power transmission patterns and beam widths of the main beams of the plurality of the power transmission patterns, the directions of the main beams and the beam widths of the main beams being in specific predetermined ranges and acquired by at least one of preliminary measurements or simulation;
    determining, after the comparison, whether the first power receiver and the second power receiver are in the main beams of the plurality of the power transmission patterns;
    calculating a minimum total time of a first power transmission period and a second power transmission period for which power amounts requested by the first and second power receivers are satisfiable using a first power transmission pattern and a second power transmission pattern, the plurality of power transmission patterns including the first power transmission pattern and the second power transmission pattern, wherein the minimum total time is determined by minimizing a sum of the first power transmission period and the second power transmission period, wherein the first power transmission period is a time length where each receiver receives the first power transmission pattern, wherein the second power transmission period is a time length where each receiver receives the second power transmission pattern, wherein a sum of each power transmission pattern received by the first power receiver satisfies a power amount in watt hours requested by the first power receiver, and wherein a sum of each power transmission pattern received by the second power receiver satisfies a power amount in watt hours requested by the second power receiver, transmitting a first radio wave by the first power transmission pattern within the first power transmission period and a second radio wave by the second power transmission pattern within the second power transmission period;

controlling transmission of a plurality of radio waves, the plurality of radio waves including the first radio wave and the second radio wave;

receiving information of each power transmission pattern and the power amount requested by the first power receiver; and receiving information of each power transmission pattern and the power amount requested by the second power receiver.

\* \* \* \* \*